United States Patent
Xia et al.

(10) Patent No.: US 9,164,828 B2
(45) Date of Patent: Oct. 20, 2015

(54) SYSTEMS AND METHODS FOR ENHANCED DATA RECOVERY IN A SOLID STATE MEMORY SYSTEM

(71) Applicant: SEAGATE TECHNOLOGY LLC, Cupertino, CA (US)

(72) Inventors: Haitao Xia, San Jose, CA (US); Fan Zhang, Milipitas, CA (US); Shu Li, San Jose, CA (US); Jun Xiao, Fremont, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 87 days.

(21) Appl. No.: 14/047,423

(22) Filed: Oct. 7, 2013

(65) Prior Publication Data

US 2015/0089330 A1    Mar. 26, 2015

Related U.S. Application Data

(60) Provisional application No. 61/883,123, filed on Sep. 26, 2013.

(51) Int. Cl.
  *G11C 29/00*    (2006.01)
  *G06F 11/10*    (2006.01)
  *H03M 13/11*    (2006.01)
  *H03M 13/37*    (2006.01)
  *H03M 13/00*    (2006.01)

(52) U.S. Cl.
  CPC ....... *G06F 11/1008* (2013.01); *H03M 13/1111* (2013.01); *H03M 13/1128* (2013.01); *H03M 13/1142* (2013.01); *H03M 13/3723* (2013.01); *H03M 13/3746* (2013.01); *H03M 13/6337* (2013.01)

(58) Field of Classification Search
  None
  See application file for complete search history.

(56) References Cited

U.S. PATENT DOCUMENTS

| | | | |
|---|---|---|---|
| 5,892,896 A | 4/1999 | Shingo | |
| 6,516,425 B1 | 2/2003 | Belhadj et al. | |
| 6,651,032 B2 | 11/2003 | Peterson et al. | |
| 7,127,549 B2 | 10/2006 | Sinclair | |
| 7,254,692 B1 | 8/2007 | Teoh et al. | |
| 7,310,699 B2 | 12/2007 | Sinclair | |
| 7,523,013 B2 | 4/2009 | Gorobets et al. | |
| 7,558,109 B2 * | 7/2009 | Brandman et al. | 365/185.03 |
| 7,596,656 B2 | 9/2009 | Elhamias | |
| 7,721,146 B2 | 5/2010 | Polisetti et al. | |
| 7,778,077 B2 | 8/2010 | Gorobets et al. | |
| 7,966,550 B2 * | 6/2011 | Mokhlesi et al. | 714/780 |
| 8,010,738 B1 | 8/2011 | Chilton et al. | |
| 8,151,137 B2 | 4/2012 | McKean | |

(Continued)

FOREIGN PATENT DOCUMENTS

KR    10/2009-0013394    2/2009

*Primary Examiner* — Daniel McMahon
(74) *Attorney, Agent, or Firm* — Holland & Hart LLP (57) ABSTRACT

Systems and method relating generally to data processing, and more particularly to systems and methods for accessing a data set from a solid state storage device, using a data decoding circuit to apply a data decoding algorithm to the data set to yield a decoded output, where the decoded output includes at least one error, identifying at least one critical location in the data set, estimating a voltage associated with the data in the data set corresponding to the critical location, calculating soft information corresponding to the critical location based at least in part on the estimated voltage, and re-applying the data decoding algorithm to the data set guided by the soft information to yield an updated decoded output.

19 Claims, 5 Drawing Sheets

(56) References Cited

U.S. PATENT DOCUMENTS

| | | | |
|---|---|---|---|
| 8,174,912 B2 | 5/2012 | Warren | |
| 8,176,367 B2 | 5/2012 | Dreifus | |
| 8,289,768 B2 | 10/2012 | Warren et al. | |
| 8,381,077 B2 | 2/2013 | Warren | |
| 8,406,048 B2* | 3/2013 | Yang et al. | 365/185.02 |
| 8,458,416 B2 | 6/2013 | Warren et al. | |
| 8,464,131 B2* | 6/2013 | Sharon et al. | 714/763 |
| 8,499,220 B2 | 7/2013 | Warren | |
| 8,797,795 B2* | 8/2014 | Graef et al. | 365/185.02 |
| 2002/0091965 A1 | 7/2002 | Moshayedi | |
| 2005/0044459 A1 | 2/2005 | Scheuerlein et al. | |
| 2005/0172067 A1 | 8/2005 | Sinclair | |
| 2005/0204187 A1 | 9/2005 | Lee et al. | |
| 2005/0209804 A1 | 9/2005 | Basso et al. | |
| 2006/0245248 A1 | 11/2006 | Hu | |
| 2007/0028040 A1 | 2/2007 | Sinclair | |
| 2007/0266200 A1 | 11/2007 | Gorobets et al. | |
| 2008/0010557 A1 | 1/2008 | Kume | |
| 2008/0046779 A1 | 2/2008 | Merchant et al. | |
| 2008/0086275 A1 | 4/2008 | Astigarraga et al. | |
| 2008/0092026 A1* | 4/2008 | Brandman et al. | 714/793 |
| 2008/0162079 A1 | 7/2008 | Astigarraga et al. | |
| 2008/0307270 A1 | 12/2008 | Li | |
| 2009/0063895 A1 | 3/2009 | Smith | |
| 2009/0067303 A1 | 3/2009 | Poo et al. | |
| 2009/0147698 A1 | 6/2009 | Potvin | |
| 2009/0172280 A1 | 7/2009 | Trika et al. | |
| 2009/0204853 A1 | 8/2009 | Diggs et al. | |
| 2009/0282301 A1 | 11/2009 | Flynn et al. | |
| 2010/0121609 A1 | 5/2010 | Gorinevsky | |
| 2010/0122148 A1 | 5/2010 | Flynn et al. | |
| 2010/0306577 A1 | 12/2010 | Dreifus et al. | |
| 2010/0306580 A1 | 12/2010 | McKean et al. | |
| 2011/0058415 A1 | 3/2011 | Warren | |
| 2011/0060862 A1 | 3/2011 | Warren | |
| 2011/0060865 A1 | 3/2011 | Warren et al. | |
| 2011/0161775 A1* | 6/2011 | Weingarten | 714/755 |
| 2012/0102261 A1 | 4/2012 | Burger et al. | |
| 2012/0110376 A1 | 5/2012 | Dreifus et al. | |

* cited by examiner

SYSTEMS AND METHODS FOR ENHANCED DATA RECOVERY IN A SOLID STATE MEMORY SYSTEM

CROSS REFERENCE TO RELATED APPLICATIONS

The present application claims priority to (is a non-provisional of) U.S. Pat. App. No. 61/883,123 entitled "Systems and Methods for Enhanced Data Recovery in a Solid State Memory System", and filed Sep. 26, 2013 by Xia et al. The entirety of the aforementioned provisional patent application is incorporated herein by reference for all purposes.

FIELD OF THE INVENTION

Systems and method relating generally to data processing, and more particularly to systems and methods for recovering data from a solid state memory.

BACKGROUND

Solid state storage device use a variety of error correction schemes to assure tat data originally written is later properly accessed. In some cases, such schemes are unable to effectively correct one or more errors. This problem becomes more acute as the number of bits per cell in a solid state cell is increased.

Hence, for at least the aforementioned reasons, there exists a need in the art for advanced systems and methods for recovering data from a solid state storage device.

SUMMARY

Systems and method relating generally to data processing, and more particularly to systems and methods for combining recovered portions of a data set.

Various embodiments of the present invention provide data processing systems that include a solid state memory device, and a data processing circuit. The data processing circuit includes a soft information calculation circuit and a data decoding circuit. The soft information calculation circuit operable to calculate soft information indicating a probability that one or more elements of a data set derived from the solid state memory device represent data originally stored to the solid state memory device. The data decoding circuit is operable to apply a data decoding algorithm to the data set derived from the solid state memory device guided by the soft information.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Systems and method relating generally to data processing, and more particularly to systems and methods for combining recovered portions of a data set.

Various embodiments of the present invention provide data processing systems that include a solid state memory device, and a data processing circuit. The data processing circuit includes a soft information calculation circuit and a data decoding circuit. The soft information calculation circuit operable to calculate soft information indicating a probability that one or more elements of a data set derived from the solid state memory device represent data originally stored to the solid state memory device. The data decoding circuit is operable to apply a data decoding algorithm to the data set derived from the solid state memory device guided by the soft information. In some instances of the aforementioned embodiments, the data decoding algorithm is a low density parity check decoding algorithm. In some cases, the data processing circuit is implemented as part of an integrated circuit. In one or more cases, the data processing circuit and the solid state memory device are implemented on the same integrated circuit. In one or more cases, the solid state memory device includes a number of flash memory cells. These flash memory cells may be capable of representing more than one bit of data. In particular cases, the flash memory cells are NAND flash memory cells In various instances of the aforementioned embodiments, the data processing circuit further includes a limited location re-read request circuit operable to identify a subset of elements of the data set derived from the solid state memory device exhibiting an increased likelihood of error. In some cases, identifying the subset of elements of the data set derived from the solid state memory device exhibiting an increased likelihood of error is based at least in part on one of or a combination of the following indicators: a location in the data set where a large number of bit modifications occurred during application of the data decoding algorithm, a location in the data set associated with a large number of unsatisfied parity check equations, a location in the data set associated with a trapping set, and/or a location in the data set exhibiting a high variance from the location to a proximate location. In some cases, the data processing circuit is further operable to cause the identified subset of elements of the data set to be re-read using different threshold values applied to the solid state memory device to yield a number of re-read values, and to estimate a voltage stored by the solid state memory device for each of the identified subset of elements of the data set. In such cases, the soft information calculation circuit is operable to calculate the soft information based at least in part on the estimated voltage stored by the solid state memory device for each of the identified subset of elements of the data set.

In other instances of the aforementioned embodiments, the solid state memory device is operable to provide a voltage corresponding to at least one element a data set accessible from the solid state memory device. In such cases, the soft information calculation circuit is operable to calculate the soft information based at least in part on the voltage corresponding to the at least one element a data set accessible from the solid state memory device.

Other embodiments of the present invention provide methods for recovering data that include: accessing a data set from a solid state storage device; using a data decoding circuit to apply a data decoding algorithm to the data set to yield a decoded output, where the decoded output includes at least one error; identifying at least one critical location in the data set; estimating a voltage associated with the data in the data set corresponding to the critical location; calculating soft information corresponding to the critical location based at least in part on the estimated voltage; and re-applying the data decoding algorithm to the data set guided by the soft information to yield an updated decoded output. In some cases, the data decoding algorithm is a low density parity check decoding algorithm.

In various instances of the aforementioned embodiments, identifying the at least one critical location in the data set is based at least in part on one or a combination of the following indicators: a location in the data set where a large number of bit modifications occurred during application of the data decoding algorithm, a location in the data set associated with a large number of unsatisfied parity check equations, a location in the data set associated with a trapping set, and/or a location in the data set exhibiting a high variance from the location to a proximate location. In one or more instances of the aforementioned embodiments, estimating the voltage associated with the data in the data set corresponding to the critical location includes re-accessing data from the critical location using different threshold values applied to the solid state memory device to yield a number of re-read values, and estimating the voltage based upon the different threshold values and corresponding re-read values. In such instances, the soft information may be calculated based at least in part on the estimated voltage and a defined performance metric of the solid state storage device.

Yet other embodiments of the present invention provide electronic devices that include a storage system, and an application system. The application system is operable to perform a defined function using data accessed from the storage system. As just some examples, the defined function may be displaying the data in an audio or visual format, or performing calculations using the data. Based upon the disclosure provided herein, one of ordinary skill in the art will recognize a variety of defined functions that may be performed by the application system in accordance with different embodiments of the present invention. The storage system includes a solid state memory device, and a data processing circuit. The data processing circuit includes a soft information calculation circuit and a data decoding circuit. The soft information calculation circuit operable to calculate soft information indicating a probability that one or more elements of a data set derived from the solid state memory device represent data originally stored to the solid state memory device. The data decoding circuit is operable to apply a data decoding algorithm to the data set derived from the solid state memory device guided by the soft information.

Figure 1:
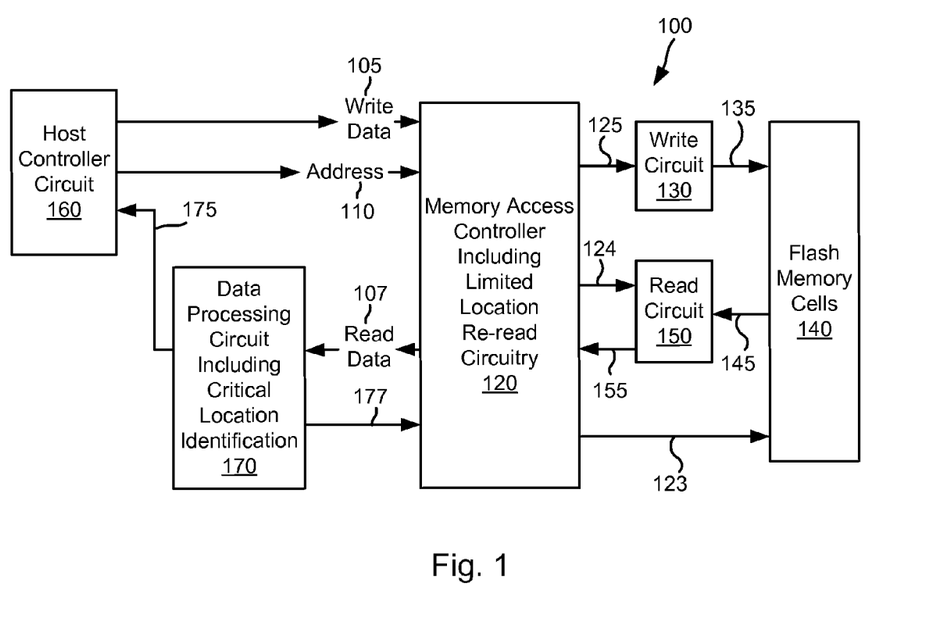
FIG. 1 shows a solid state storage device including a data processing circuit including critical location identification in accordance with various embodiments of the present invention.

Turning to FIG. 1, a solid state storage device 100 including a data processing circuit 170 including critical location identification in accordance with various embodiments of the present invention. Storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0.

A data read is effectuated when host controller circuit 160 provides address 110 along with a request to read data from the corresponding location in flash memory cells 14. Memory access controller 120 accesses a read voltage 145 from locations indicated by address 123 and compares the voltage to a number of threshold values to reduce the voltage to a multi-bit read data 155. Using the same two bit example, the following multi-bit read data 155 results:

| Voltage Input | Two Bit Data Output |
|---|---|
| >V2 | '11' |
| >V1 | '10' |
| >V0 | '00' |
| <=V0 | '01' |

This multi-bit read data 155 is provided from memory access controller 120 to data processing circuit 170 as read data 107. Data processing circuit 170 applies a data decoding algorithm to read data 107 using soft data that is fixed at defined values. The following shows a series of two bit symbols with corresponding soft data fixed at defined values:

|  | Loc. X | Loc. X + 1 | Loc. X + 2 | Loc. X + 3 | Loc. X + 4 | Loc. X + 5 |
| --- | --- | --- | --- | --- | --- | --- |
| Hard Data | '00' | '01' | '01' | '11' | '10' | '00' |
| Soft Data | Fixed | Fixed | Fixed | Fixed | Fixed | Fixed |

Where the decoding converges (i.e., the original data is recovered as indicated by, for example, satisfaction of all parity check equations in the data), the resulting decoded data 175 is provided to host controller circuit 160 in satisfaction of the read request.

Alternatively, where the decoding algorithm fails to converge, the decoding process is queried to identify data within read data 107 that is most likely incorrect. This may include, for example, identifying location in read data 107 that exhibit a high variance from one position to the next position (e.g., a transition from a '11' corresponding to the highest voltage level to a '01' corresponding to the lowest voltage level), a location in read data where a large number of bit modifications occurred during the decoding process, a location associated with a large number of unsatisfied parity check equations, and/or a location associated with a trapping set. Based upon one or a combination of the aforementioned indicators, critical locations in read data 107 are identified. These critical locations are identified by data processing circuit 170 along with refined read thresholds to memory access controller 120 as a re-read control output 177. Memory access controller 170 re-reads the identified critical locations multiple times using the refined thresholds to zero in on the actual raw voltage read from flash memory cells 140 corresponding to the critical locations. This results in a number of different values of read data 107 each corresponding to respective ones of the refined thresholds. Data processing circuit 170 uses the results of the multiple reads at different thresholds to generate an estimate of the voltage on the respective flash memory cells corresponding to the critical locations. This estimated voltage is then used to calculate soft data indicating a probability that the data received from each the flash memory cells 140 at the respective critical locations was correctly received. Locations in the original soft data that was fixed a defined values corresponding to the critical locations are modified to yield a modified soft data. Using the preceding example, the result of modifying the soft data at an identified critical location (Loc. X+2) is as follows:

|  | Loc. X | Loc. X + 1 | Loc. X + 2 | Loc. X + 3 | Loc. X + 4 | Loc. X + 5 |
| --- | --- | --- | --- | --- | --- | --- |
| Hard Data | '00' | '01' | '01' | '11' | '10' | '00' |
| Soft Data | Fixed | Fixed | Calculated | Fixed | Fixed | Fixed |

The modified soft data may be a log-likelihood ratio calculated in accordance with the following equation:

$$\text{Updated Soft Data}_i = \log\frac{(p(0 \mid y_i))}{(p(1 \mid y_i))},$$

where i indicates the particular location, and $y_i$ is the estimated voltage. $p(1|y_i)$, represents the probability of a logic '1' for the particular value of y, and $p(0|y_i)$ represents the probability of a logic '0' for the particular value of y. The values of p(1|y) and p(0|y) are predefined. In the case where flash memory cells 140 are obtained as part of an off the shelf product, the aforementioned values (or some combination thereof) are available from the manufacturer. In some embodiments of the present invention, an approximation of the aforementioned equation may be used to calculate the updated soft data. Data processing circuit 170 re-applies the data decoding algorithm to original read data 107 using the modified soft data. Where the decoding converges, the resulting decoded data 175 is provided to host controller circuit 160 in satisfaction of the read request. Otherwise, where the decoding fails to converge, an error is returned to host controller circuit 160.

Using such an approach, probability data for critical locations in data read from flash memory cells may be re-read multiple times as part of generating probability information useful in improving the data decoding process without requiring a more global re-read of the entire data set. Such an approach may be used to increase the performance of solid state storage device 100.

Figure 2:
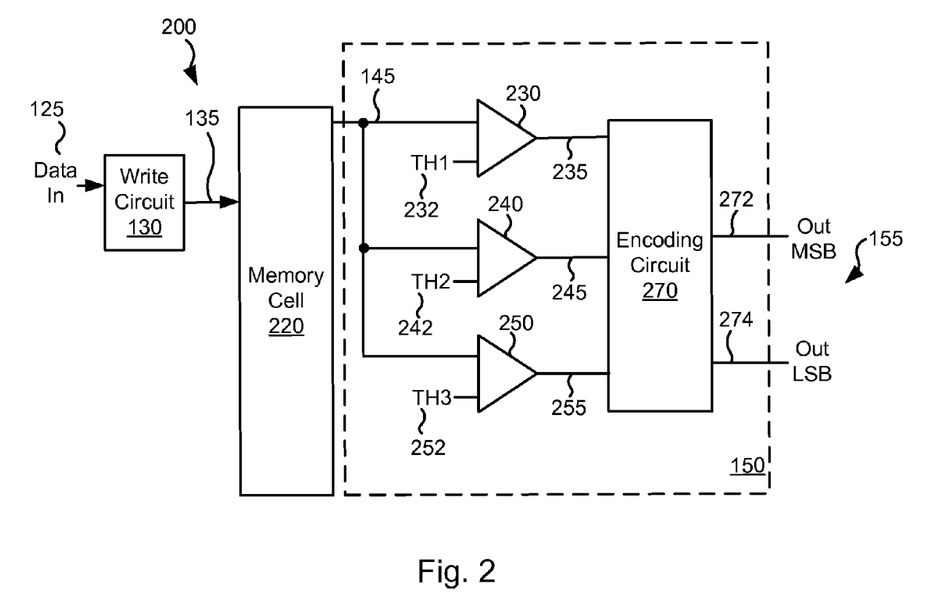
FIG. 2 shows detail of a read circuit along with other elements of the storage device of FIG. 1 that may be used in relation to one or more embodiments of the present invention.

Turning to FIG. 2, a detailed implementation 200 of read circuit along with other elements of the storage device of FIG. 1 that may be used in relation to one or more embodiments of the present invention. As shown in implementation 200, read circuit 150 receives read voltage 145 from a memory cell 220 and compares it against three thresholds (TH1, TH2, TH3) using respective threshold comparator circuits 230, 240, 250. Memory cell 220 represents one cell of flash memory cells 140. Where read voltage 145 is less than threshold TH1, all of a comparison output 235 from threshold comparator circuit 230, a comparison output 245 from threshold comparator circuit 240, and a comparison output 255 from threshold comparator circuit 250 are asserted low. Alternatively, where read voltage 145 is less than threshold TH2 and greater than threshold TH1, comparison output 235 is asserted high, and both comparison output 245 and comparison output 255 are asserted low. Where read voltage 145 is greater than threshold TH2 and threshold TH1, but less than threshold TH3, both comparison output 235 and comparison output 245 are asserted low, and comparison output 255 is asserted high. Alternatively, where read voltage 145 is greater than all of threshold TH1, threshold TH2, and threshold TH3, all of comparison output 235, comparison output 245, and comparison output 255 are asserted high.

An encoding circuit 270 encodes comparison output 235, comparison output 245, and comparison output 255 into a two bit output (MSB 272, LSB 274). The following table shows the encoding:

| Comparison Outputs | Two Bit Data Input |
| --- | --- |
| '111' | '11' |
| '110' | '10' |
| '100' | '00' |
| '000' | '01' |

The combination of MSB 272 and LSB 274 are provided as multi-bit read data 155.

Figure 3:
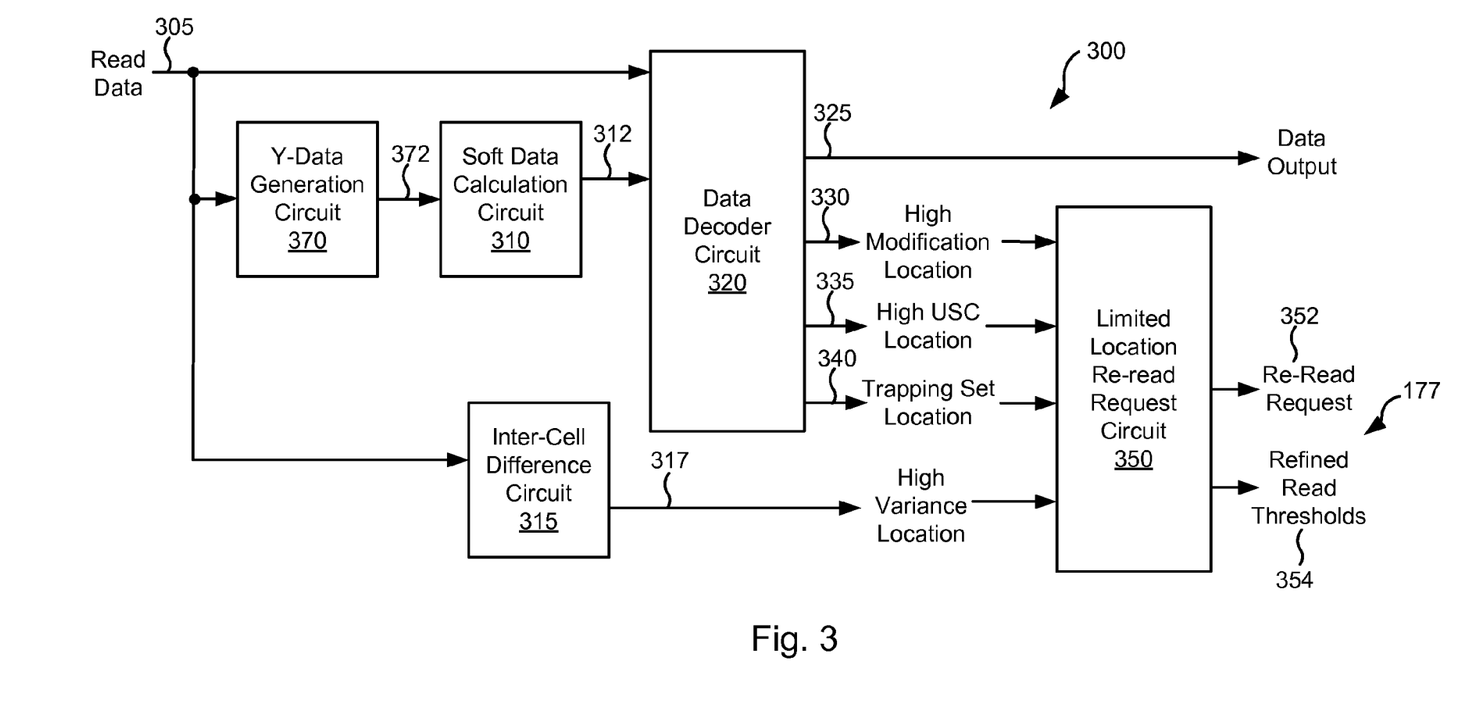
FIG. 3 shows one implementation of the data processing circuit of FIG. 1 in accordance with various embodiments of the present invention.

Turning to FIG. 3, implementation of data processing circuit 300 that may be used in place of data processing circuit 170 is shown in accordance with various embodiments of the present invention. Data processing circuit 300 includes a decoder circuit 320 that operates on a combination of soft information 312 and read data 305 that is a series of 1's and 0's (i.e., hard data). Soft information represents a probability that the hard data was properly detected (i.e., properly sensed from the memory cells). In one particular embodiment of the present invention, data decoder circuit 320 is a low density parity check decoder circuit. Data decoder circuit 320 applies a data decoding algorithm to read data 305 to yield a data output 325. During the initial application of the data decoding algorithm, soft information is set to fixed values as represented by the following table:

|  | Loc. X | Loc. X+1 | Loc. X+2 | Loc. X+3 | Loc. X+4 | Loc. X+5 |
| --- | --- | --- | --- | --- | --- | --- |
| Hard Data | '00' | '01' | '01' | '11' | '10' | '00' |
| Soft Data | Fixed | Fixed | Fixed | Fixed | Fixed | Fixed |

Where data output 325 converges, no further operation is applied to read data 305. Alternatively, where data output 325 fails to converge, a repeated read of critical locations is performed as part of updating soft information 312. In particular, data decoder circuit 320 identifies critical locations based upon one or a combination of the following criteria: locations 330 in read data 305 where a large number of bit modifications occurred during the decoding process, locations 335 in read data 305 associated with a large number of unsatisfied parity check equations, and/or locations 340 in read data 305 associated with a trapping set. In addition, an inter-cell difference circuit 315 identifies locations 317 in read data 305 that exhibit a high variance from one position to the next position (e.g., a transition from a '11' corresponding to the highest voltage level to a '01' corresponding to the lowest voltage level). All of these criterion are provided to a limited location re-read request circuit 350 which uses the information to determine which locations to identify as critical. In one particular embodiment of the present invention, a defined number of critical locations are identified, and the locations that exhibit the largest number of the aforementioned criterion up to the defined number of locations. In one particular embodiment, the defined number of critical locations is five (5). Based upon the disclosure provided herein, one of ordinary skill in the art will recognize a variety of approaches for selecting critical locations based upon the aforementioned criterion, and/or a different number of critical locations that are allowed in accordance with different embodiments of the present invention.

Limited location re-read request circuit 350 provides a re-read request 352 indicating the identified critical locations along with refined read thresholds 354 that are to be used to generate an estimate of the voltage on the respective flash memory cells corresponding to the critical locations. The combination of re-read request 352 and refined read thresholds 354 are provided as re-read control output 177. Using this information, memory access controller 120 of FIG. 1 repeatedly re-reads each of the critical locations identified in re-read request 352. Each time a given location is re-read a different set of thresholds are used to focus in on the actual voltage.

Using FIG. 2 as an example, where the value originally received for a critical location is '10' corresponding to the read voltage being greater than threshold TH1 and threshold TH2, but less than threshold TH3 (i.e., the actual voltage read from memory cell 220 is between TH2 and TH3), the refined thresholds are identified by maintaining threshold TH1 and threshold TH3, and increasing threshold TH2 to half way between the previous value of threshold TH2 and TH3. A re-read is then made. Where the value read changes from '10' to a '00', then the actual voltage is less than the updated value of threshold TH2 and greater than the previous value of threshold TH2. In such a case, the value of threshold TH2 is increased to half way between the previously updated value of threshold TH2 and the original value of threshold TH2. Otherwise the value read remains a '10', the actual voltage is greater than threshold TH2 and less than threshold TH3. In this case, the value of threshold TH2 is increased to half way between the previously updated value of threshold TH3. With the newly updated value of threshold TH2, the critical location is again re-read, and the process of updating the value of threshold TH2 is repeated. This may be repeated until threshold TH2 approximates the value of the actual voltage. In one particular embodiment of the present invention, the approximation is acceptable when the change to the next value of threshold TH2 is less than five (5) percent of the overall voltage range of memory cell 220. Based upon the disclosure provided herein, one of ordinary skill in the art will recognize a range of acceptable approximations of the actual voltage that may be used in relation to different embodiments of the present invention. Further, while the preceding approach for estimating the actual voltage relies on modifying one of the threshold values (e.g., threshold TH2), other embodiments of the present invention may modify two or more of the threshold values on each re-read in an attempt to isolate the actual voltage.

A Y-data generation circuit 370 determines an actual voltage (i.e., a y-value) based upon the combination of knowledge of read data 305 re-read multiple times and the threshold values being used in each re-read. The resulting estimated voltage 372 is provided to a soft data calculation circuit 310. Using the example above, Y-data generation circuit 370 would simply select the updated value of threshold TH2 as estimated voltage 372. Soft data calculation circuit 310 calculates updated soft data for the critical location to which estimated voltage 372 corresponds in accordance with the following equation:

$$\text{Updated Soft } Data_i = \log \frac{(p(0 \mid y_i))}{(p(1 \mid y_i))},$$

where i indicates the particular location, and $y_i$ is the estimated voltage. $p(1|y_i)$ represents the probability of a logic '1' for the particular value of y, and $p(0|y_i)$ represents the probability of a logic '0' for the particular value of y. The values of $p(1|y)$ and $p(0|y)$ predefined. Further, soft data calculation circuit changes the previous fixed value of soft information 312 to reflect the newly calculated value as represented by the following table where the critical location is Loc. X+2:

|  | Loc. X | Loc. X+1 | Loc. X+2 | Loc. X+3 | Loc. X+4 | Loc. X+5 |
| --- | --- | --- | --- | --- | --- | --- |
| Hard Data | '00' | '01' | '01' | '11' | '10' | '00' |
| Soft Data | Fixed | Fixed | Calculated | Fixed | Fixed | Fixed |

Data decoder circuit 320 re-applies the data decoding algorithm to the original read data 305 guided by the modified soft information. Where the data decoding algorithm converges, data decoder circuit 320 provides the result as data output 325. Otherwise, data decoder circuit 320 indicates an error.

Figure 4:
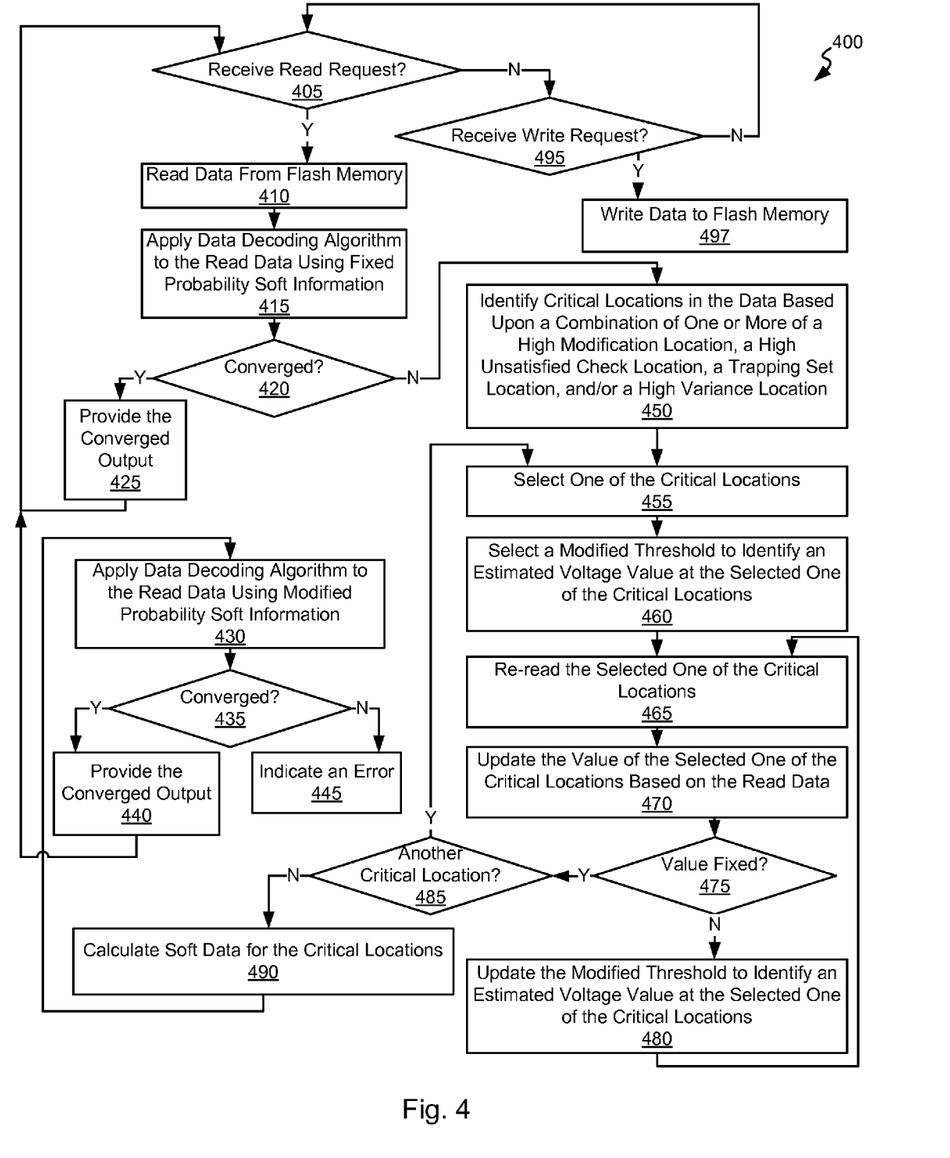
FIG. 4 is a flow diagram showing a method for recovering data from a solid state storage device in accordance with various embodiments of the present invention.

Turning to FIG. 4, a flow diagram 400 shows a method for recovering data from a solid state storage device in accordance with various embodiments of the present invention. Following flow diagram 400, it is determined whether a read request has been received from a host controller (block 405). Where a read request is received (block 405), data is read from a flash memory device at a location indicated by an address included in the read request (block 410). This read process may be done using any read process known in the art.

A data decoding algorithm is applied to the read data using soft information set to fixed values to yield a decoded output (block 415). An example subset of the combination of the read data and the soft information is shown in the following table:

|           | Loc. X | Loc. X+1 | Loc. X+2 | Loc. X+3 | Loc. X+4 | Loc. X+5 |
|-----------|--------|----------|----------|----------|----------|----------|
| Hard Data | '00'   | '01'     | '01'     | '11'     | '10'     | '00'     |
| Soft Data | Fixed  | Fixed    | Fixed    | Fixed    | Fixed    | Fixed    |

In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

It is determined whether the resulting decoded output converged (i.e., the original data was recovered as indicated by, for example, satisfaction of all parity check equations in the data)(block 420). Where the decoded output converges (block 420), the resulting decoded output is provided (block 425), and the process is returned to block 405.

Alternatively, where it is determined that the resulting decoded output failed to converge (i.e., the original data was not recovered) (block 420), critical locations in the data are determined (block 450). The critical locations are identified based upon one or a combination of the following criteria: locations in the read data where a large number of bit modifications occurred during the decoding process, locations in the read data associated with a large number of unsatisfied parity check equations, locations in the read data associated with a trapping set, and/or locations in the read data that exhibit a high variance from one position to the next position (e.g., a transition from a '11' corresponding to the highest voltage level to a '01' corresponding to the lowest voltage level). In one particular embodiment of the present invention, a defined number of critical locations are identified, and the locations that exhibit the largest number of the aforementioned criterion up to the defined number of locations. In one particular embodiment, the defined number of critical locations is five (5). Based upon the disclosure provided herein, one of ordinary skill in the art will recognize a variety of approaches for selecting critical locations based upon the aforementioned criterion, and/or a different number of critical locations that are allowed in accordance with different embodiments of the present invention.

One of the critical locations is selected (block 455), and a modified threshold is selected to estimate an underlying voltage stored in the flash memory at the selected critical location (block 460). Using FIG. 2 as an example, where the value originally received for a critical location is '10' corresponding to the read voltage being greater than threshold TH1 and threshold TH2, but less than threshold TH3 (i.e., the actual voltage read from memory cell 220 is between TH2 and TH3), the modified thresholds include maintaining threshold TH1 and threshold TH3, and increasing threshold TH2 to half way between the previous value of threshold TH2 and TH3. Returning to FIG. 4, using these modified thresholds, the selected critical location is re-read (block 465). The estimated voltage corresponding to the re-read critical location is updated to reflect the new threshold data (block 470).

It is determined whether the estimated voltage is sufficiently close to the actual value (block 475). This may be done, for example, by determining how large the next step in changing the threshold would be. Where the step is sufficiently small, the estimated voltage is considered sufficiently accurate. Where the estimated voltage is not sufficiently accurate (block 475), the modified threshold is updated again to more closely estimate the estimated voltage (block 480). Again, using FIG. 2 as an example, where the value read changes from '10' to a '00', then the actual voltage is less than the updated value of threshold TH2 and greater than the previous value of threshold TH2. In such a case, the value of threshold TH2 is increased to half way between the previously updated value of threshold TH2 and the original value of threshold TH2. Otherwise the value read remains a '10', the actual voltage is greater than threshold TH2 and less than threshold TH3. In this case, the value of threshold TH2 is increased to half way between the previously updated value of threshold TH3. Referring again to FIG. 4, the processes of blocks 460-475 are repeated using the updated threshold TH2. The processes of blocks 465-480 are repeated until threshold TH2 approximates the value of the actual voltage. In one particular embodiment of the present invention, the approximation is acceptable when the change to the next value of threshold TH2 is less than five (5) percent of the overall voltage range of the memory cell being read. Based upon the disclosure provided herein, one of ordinary skill in the art will recognize a range of acceptable approximations of the actual voltage that may be used in relation to different embodiments of the present invention. Further, while the preceding approach for estimating the actual voltage relies on modifying one of the threshold values (e.g., threshold TH2), other embodiments of the present invention may modify two or more of the threshold values on each re-read in an attempt to isolate the actual voltage.

Where, on the other hand, the estimated voltage is sufficiently accurate (block 475), it is determined whether another critical location remains to be characterized (block 485). Where another critical location remains to be characterized (block 485), the processes of blocks 455-485 are repeated to establish an estimated voltage for each of the critical locations.

Where no more critical locations remain to be characterized (block 485), soft data is calculated for the critical locations using the previously established estimated voltages for the critical locations (block 490). This calculation may be done in accordance with the following equation:

$$\text{Upland Soft } Data_i = \log \frac{(p(0 \mid y_i))}{(p(1 \mid y_i))},$$

where i indicates the particular location, and $y_i$ is the estimated voltage. $p(1 \mid y_i)$ represents the probability of a logic '1' for the particular value of y, and $p(0 \mid y_i)$ represents the probability of a logic '0' for the particular value of y. The values of $p(1 \mid y)$ and $p(0 \mid y)$ are predefined. The calculated soft data is incorporated into the previously fixed value soft information. Where the critical location is Loc. X+2, the updated soft information is set forth in the following table:

|           | Loc. X | Loc. X+1 | Loc. X+2   | Loc. X+3 | Loc. X+4 | Loc. X+5 |
|-----------|--------|----------|------------|----------|----------|----------|
| Hard Data | '00'   | '01'     | '01'       | '11'     | '10'     | '00'     |
| Soft Data | Fixed  | Fixed    | Calculated | Fixed    | Fixed    | Fixed    |

The data decoding algorithm is re-applied to the read data using the modified soft information to yield a decoded output (block 430). It is determined whether the resulting decoded output converged (i.e., the original data was recovered as indicated by, for example, satisfaction of all parity check equations in the data)(block 420). Where the decoded output converges (block 435), the resulting decoded output is provided (block 440), and the process is returned to block 405. Otherwise, where the decoded output fails to converge (block 435), an error is indicated (block 445), and the process is returned to block 405.

Alternatively, where a read request is not received (block 405), it is determined whether a write request has been received (block 495). Where a write request is received (block 495), data received is formatted and written to a location in the memory cells indicated by an address received as part of the write request (block 497), and the process returns to block 405.

Figure 5:
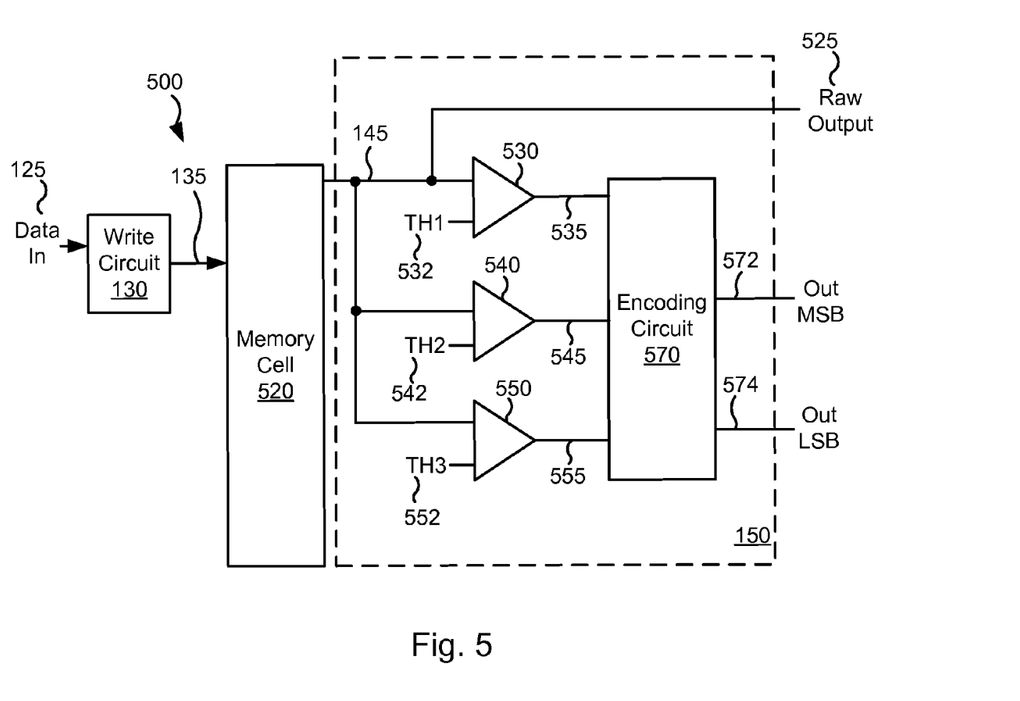
FIG. 5 shows detail of a read circuit including a raw output in accordance with some embodiments of the present invention.

Turning to FIG. 5, a detailed implementation 500 of read circuit along with other elements of the storage device of FIG. 1 that may be used in relation to one or more embodiments of the present invention. As shown in implementation 500, read circuit 150 receives read voltage 145 from a memory cell 520 and compares it against three thresholds (TH1, TH2, TH3) using respective threshold comparator circuits 530, 540, 550. Memory cell 520 represents one cell of flash memory cells 140. Where read voltage 145 is less than threshold TH1, all of a comparison output 535 from threshold comparator circuit 530, a comparison output 545 from threshold comparator circuit 540, and a comparison output 555 from threshold comparator circuit 550 are asserted low. Alternatively, where read voltage 145 is less than threshold TH2 and greater than threshold TH1, comparison output 535 is asserted high, and both comparison output 545 and comparison output 555 are asserted low. Where read voltage 145 is greater than threshold TH2 and threshold TH1, but less than threshold TH3, both comparison output 535 and comparison output 545 are asserted low, and comparison output 555 is asserted high. Alternatively, where read voltage 145 is greater than all of threshold TH1, threshold TH2, and threshold TH3, all of comparison output 535, comparison output 545, and comparison output 555 are asserted high.

An encoding circuit 570 encodes comparison output 535, comparison output 545, and comparison output 555 into a two bit output (MSB 572, LSB 574). The following table shows the encoding:

| Comparison Outputs | Two Bit Data Input |
|---|---|
| '111' | '11' |
| '110' | '10' |
| '100' | '00' |
| '000' | '01' |

The combination of MSB 572 and LSB 574 are provided as multi-bit read data 155. In addition, a raw output 525 is provided. Raw output 525 may be either an analog voltage value or a digital representation of the analog voltage value provided from memory cell 520. As the actual voltage value is provided, the need for estimated the voltage employed in the approach discussed above in relation to FIGS. 2-4. The actual voltage may be used to calculate soft data for a particular critical location or may be used to calculate soft data for every location depending upon the implementation.

Figure 6:
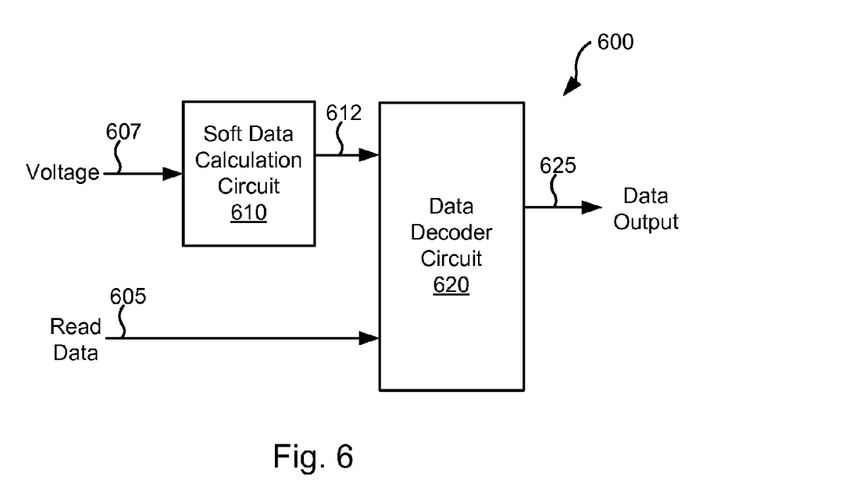
FIG. 6 shows another implementation of the data processing circuit of FIG. 1 in accordance with various embodiments of the present invention.

Turning to FIG. 6, another implementation of a data processing circuit 600 is shown that may be used in relation to data processing circuit 170 of FIG. 1 is shown in accordance with various embodiments of the present invention where voltage data is available from the memory cells as discussed above in relation to FIG. 5. Data processing circuit 600 includes data decoder circuit 620 that operates on a combination of soft information 612 and read data 605 that is a series of 1's and 0's (i.e., hard data). Soft information 612 represents a probability that corresponding hard data (i.e., read data 605) was properly detected, and is calculated by a soft data calculation circuit 610 based upon the voltage information 607 provided from each of the memory cells. The soft information is calculated in accordance with the following equation:

$$\text{Upland Soft } Data_i = \log \frac{(p(0 \mid y_i))}{(p(1 \mid y_i))},$$

where i indicates the particular location, and $y_i$ is the actual voltage received as voltage 607 for each element (i) of read data 605. $p(1|y_i)$ represents the probability of a logic '1' for the particular value of y, and $p(0|y_i)$ represents the probability of a logic '0' for the particular value of y. The values of $p(1|y)$ and $p(0|y)$ are predefined. The calculated soft data is incorporated into the previously fixed value soft information. Where the critical location is Loc. X+2, the updated soft information is set forth in the following table:

| | Loc. X | Loc. X+1 | Loc. X+2 | Loc. X+3 | Loc. X+4 | Loc. X+5 |
|---|---|---|---|---|---|---|
| Hard Data | '00' | '01' | '01' | '11' | '10' | '00' |
| Soft Data | Calculated | Calculated | Calculated | Calculated | Calculated | Calculated |

Data decoder circuit 620 applies a data decoding algorithm to the combination of soft information and read data 605 to yield a data output 625. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

Figure 7:
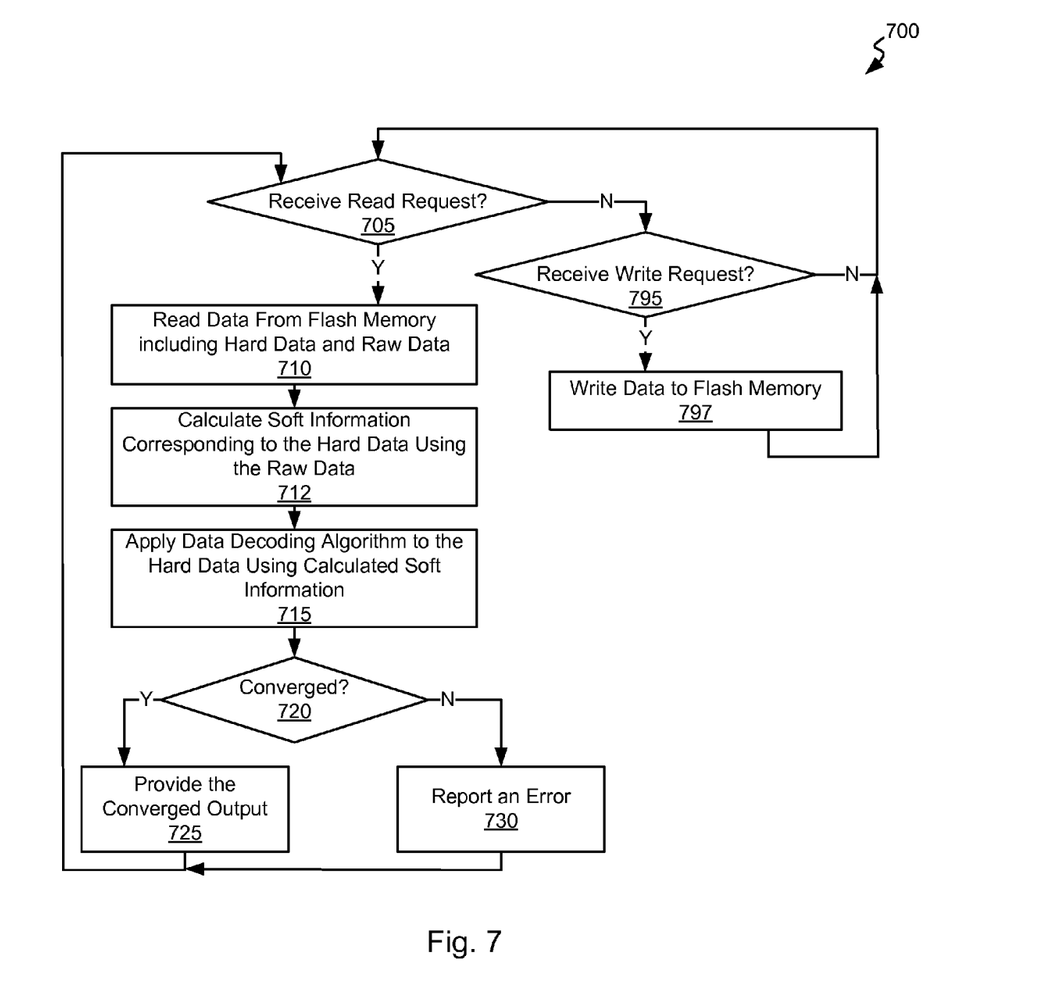
FIG. 7 is a flow diagram showing a method for recovering data from a solid state storage device in accordance with other embodiments of the present invention.

Turning to FIG. 7, a flow diagram 700 shows a method for recovering data from a solid state storage device in accordance with other embodiments of the present invention using voltage based soft information. Following flow diagram 700, it is determined whether a read request has been received from a host controller (block 705). Where a read request is received (block 705), data is read from a flash memory device at a location indicated by an address included in the read request (block 710). The data includes both hard data (i.e., the binary output representing the read data from the memory cell) and raw data (i.e., voltage data corresponding to the read data). Soft information is calculated using the raw data (block 712). The soft information is calculated in accordance with the following equation:

$$\text{Updated Soft } Data_i = \log \frac{(p(0 \mid y_i))}{(p(1 \mid y_i))},$$

where i indicates the particular location, and $y_i$ is the actual voltage received as the raw data for each element (i) of the hard data. $p(1|y_i)$ represents the probability of a logic '1' for the particular value of y, and p(0|y$_i$) represents the probability of a logic '0' for the particular value of y. The values of p(1|y) and p(0|y) are predefined.

A data decoding algorithm is applied to the hard data guided by the calculated soft information to yield a decoded output (block 715). In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

It is determined whether the resulting decoded output converged (i.e., the original data was recovered as indicated by, for example, satisfaction of all parity check equations in the data)(block 720). Where the decoded output converges (block 720), the resulting decoded output is provided (block 725), and the process is returned to block 705. Otherwise, an error is indicated (block 730), and the process is returned to block 705.

Alternatively, where a read request is not received (block 705), it is determined whether a write request has been received (block 795). Where a write request is received (block 795), data received is formatted and written to a location in the memory cells indicated by an address received as part of the write request (block 797), and the process returns to block 705.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
a solid state memory device; and
a data processing circuit to access a data set from the solid state memory device, the data processing circuit including:
a limited location re-read request circuit operable to identify a subset of elements of the data set derived from the solid state memory device exhibiting an increased likelihood of error, wherein identifying the subset of elements of the data set is based at least in part on selecting, up to a predetermined number of locations, one or more locations from the elements in the data set exhibiting the highest voltage variances from a first location to a subsequent location;
a soft information calculation circuit operable to calculate soft information indicating a probability that one or more elements of a data set derived from the solid state memory device represent data originally stored to the solid state memory device; and
a data decoding circuit operable to apply a data decoding algorithm to the data set derived from the solid state memory device guided by the soft information.

2. The data processing system of claim 1, wherein the data decoding algorithm is a low density parity check decoding algorithm.

3. The data processing system of claim 1, wherein identifying the subset of elements of the data set derived from the solid state memory device exhibiting an increased likelihood of error is based at least in part on an indicator selected from a group comprising:
one or more locations up to the predetermined number of locations selected from the elements in the data set that have the most number of bit modifications occurring during application of the data decoding algorithm,
one or more locations up to the predetermined number of locations selected from the elements in the data set associated with the most number of unsatisfied parity check equations, and
a location in the data set associated with a trapping set.

4. The data processing system of claim 1, wherein the data processing circuit is further operable to cause the identified subset of elements of the data set to be re-read using different threshold values applied to the solid state memory device to yield a number of re-read values, and to estimate a voltage stored by the solid state memory device for each of the identified subset of elements of the data set.

5. The data processing system of claim 4, wherein the soft information calculation circuit is operable to calculate the soft information based at least in part on the estimated voltage stored by the solid state memory device for each of the identified subset of elements of the data set.

6. The data processing system of claim 1, wherein the solid state memory device is operable to provide a voltage corresponding to at least one element of a data set accessible from the solid state memory device.

7. The data processing system of claim 6, wherein the soft information calculation circuit is operable to calculate the soft information based at least in part on the voltage corresponding to the at least one element of a data set accessible from the solid state memory device.

8. The data processing system of claim 1, wherein the data processing circuit is implemented as part of an integrated circuit.

9. The data processing system of claim 1, wherein the data processing circuit and the solid state memory device are implemented on the same integrated circuit.

10. The data processing system of claim 1, wherein the solid state memory device includes a number of flash memory cells.

11. The data processing system of claim 10, wherein each of the flash memory cells is able to hold a charge distinguishable as two bits of data.

12. The data processing system of claim 10, wherein the flash memory cells are NAND flash memory cells.

13. A method for recovering data, the method comprising:
accessing a data set from a solid state storage device;
using a data decoding circuit to apply a data decoding algorithm to the data set to yield a decoded output;

determining whether the decoded output converges, wherein the decoded output includes at least one error;

upon determining the decoded output fails to converge, identifying at least one critical location in the data set, wherein identifying the at least one critical location in the data set is based at least in part on selecting, up to a predetermined number of locations, one or more locations from the elements in the data set exhibiting the highest voltage variances from a first location to a subsequent location;

estimating a voltage associated with the data in the data set corresponding to the critical location;

calculating soft information corresponding to the critical location based at least in part on the estimated voltage; and re-applying the data decoding algorithm to the data set guided by the soft information to yield an updated decoded output.

14. The method of claim 13, wherein the data decoding algorithm is a low density parity check decoding algorithm.

15. The method of claim 13, wherein identifying the at least one critical location in the data set is based at least in part on an indicator selected from a group comprising:
one or more locations up to the predetermined number of locations selected from the elements in the data set that have the most number of bit modifications occurring during application of the data decoding algorithm,
one or more locations up to the predetermined number of locations selected from the elements in the data set associated with the most number of unsatisfied parity check equations, and
a location in the data set associated with a trapping set.

16. The method of claim 13, wherein estimating the voltage associated with the data in the data set corresponding to the critical location includes re-accessing the data from the critical location using different threshold values applied to the solid state memory device to yield a number of re-read values, and estimating the voltage based upon the different threshold values and corresponding re-read values.

17. The method of claim 16, wherein the soft information is calculated based at least in part on the estimated voltage and a defined performance metric of the solid state storage device.

18. An electronic device, the electronic device including:
a storage system including:
a solid state memory device; and
a data processing circuit to access a data set from the solid state memory device, the data processing circuit including:
a limited location re-read request circuit to identify at least one critical location in the data set, wherein identifying the at least one critical location in the data set is based at least in part on selecting, up to a predetermined number of locations, one or more locations from the elements in the data set exhibiting the highest voltage variances from a first location to a subsequent location;
a soft information calculation circuit operable to calculate soft information indicating a probability that one or more elements of a data set derived from the solid state memory device represent data originally stored to the solid state memory device;
a data decoding circuit operable to apply a data decoding algorithm to the data set derived from the solid state memory device guided by the soft information; and
an application system operable to perform a defined function using data accessed from the storage system.

19. The electronic device of claim 18, wherein:
identifying the at least one critical location from the elements of the data set is based at least in part on an indicator selected from a group comprising:
one or more locations up to the predetermined number of locations selected from the elements in the data set that have the most number of bit modifications occurring during application of the data decoding algorithm,
one or more locations up to the predetermined number of locations selected from the elements in the data set associated with the most number of unsatisfied parity check equations, and
a location in the data set associated with a trapping set; and
the data processing circuit is further operable to cause the identified subset of elements of the data set to be re-read using different threshold values applied to the solid state memory device to yield a number of re-read values, and to estimate a voltage stored by the solid state memory device for each of the identified subset of elements of the data set, and wherein the soft information calculation circuit is operable to calculate the soft information based at least in part on the estimated voltage stored by the solid state memory device for each of the identified subset of elements of the data set.

* * * * *